(12) United States Patent
Jain et al.

(10) Patent No.: US 9,484,919 B1
(45) Date of Patent: Nov. 1, 2016

(54) SELECTION OF LOGIC PATHS FOR REDUNDANCY

(71) Applicant: Xilinx, Inc., San Jose, CA (US)

(72) Inventors: Praful Jain, Los Gatos, CA (US);
Pierre Maillard, San Jose, CA (US);
James Karp, Saratoga, CA (US);
Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 380 days.

(21) Appl. No.: 14/266,547

(22) Filed: Apr. 30, 2014

(51) Int. Cl.
*H03K 19/003* (2006.01)

(52) U.S. Cl.
CPC .............. *H03K 19/00392* (2013.01)

(58) Field of Classification Search
CPC ............ H03K 19/00392; G06F 2217/70
USPC .......................................... 326/10
See application file for complete search history.

(56) References Cited

U.S. PATENT DOCUMENTS

| | | | |
|---|---|---|---|
| 4,964,126 A * | 10/1990 | Musicus | G06F 11/16 714/785 |
| 5,799,022 A * | 8/1998 | Williams | G06F 11/184 714/11 |
| 6,621,325 B2 | 9/2003 | Hart et al. | |
| 6,777,978 B2 | 8/2004 | Hart et al. | |
| 7,089,527 B2 | 8/2006 | Hart et al. | |
| 7,386,826 B1 | 6/2008 | Keller et al. | |
| 9,112,490 B1 * | 8/2015 | Hamlet | G06F 17/505 |
| 2003/0041301 A1 * | 2/2003 | Ryoo | H04B 1/74 714/797 |
| 2004/0124899 A1 * | 7/2004 | Cavazos | H03K 3/0375 327/199 |
| 2009/0204933 A1 * | 8/2009 | Rezgui | H03K 19/0033 716/122 |
| 2013/0198701 A1 * | 8/2013 | Platzker | G06F 17/5031 716/102 |
| 2013/0305199 A1 * | 11/2013 | He | G06F 17/5054 716/104 |

OTHER PUBLICATIONS

Pratt, Brian et al., "Improving FPGA Design Robustness with Partial TMR" *44th Annual IEEE International Reliability Physics Symposium Proceedings*, Mar. 26, 2006, pp. 226-232, IEEE, Piscataway, New Jersey, USA.
Pratt, Brian et al., "Fine-Grain SEU Mitigation for FPGAs Using Partial TMR" *IEEE Transactions on Nuclear Science*, Aug. 2008, pp. 2274-2280, IEEE, Piscataway, New Jersey, USA.

* cited by examiner

*Primary Examiner* — Don Le
(74) *Attorney, Agent, or Firm* — LeRoy D. Maunu

(57) ABSTRACT

Approaches are disclosed for processing a circuit design to protect against single event upsets. A logic path of the circuit design is selected for redundancy based on a total of failure rates of circuit elements in the logic path being greater than a product of a target reduction in failure rate of the logic path and a failure rate of a voting circuit. The circuit design is modified to include at least three instances of the logic path coupled in parallel and a voting circuit coupled to receive output signals from the instances of the logic path. The modified circuit design is stored in a memory.

20 Claims, 7 Drawing Sheets

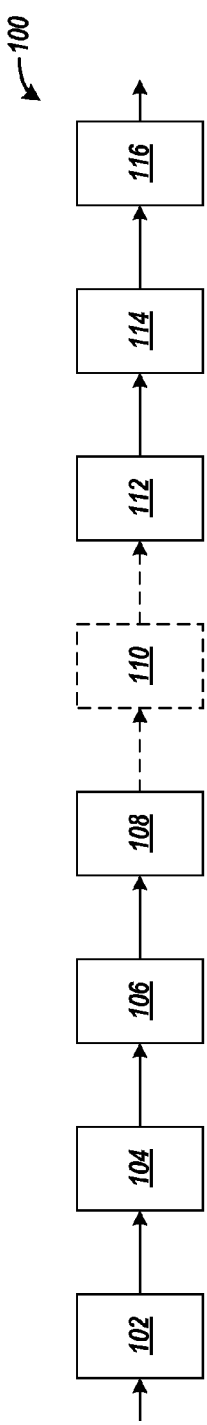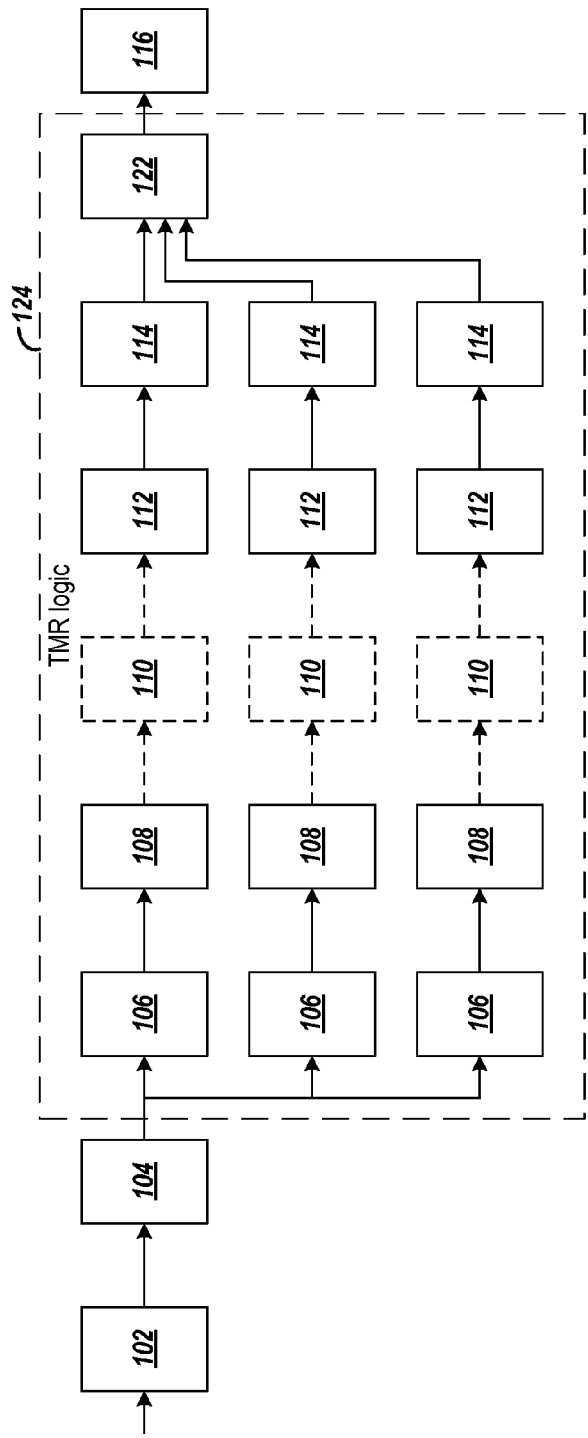
FIG. 1
FIG. 2

SELECTION OF LOGIC PATHS FOR REDUNDANCY

TECHNICAL FIELD

The disclosure generally relates to automating the selection of logic paths for which to provide redundancy in a circuit design.

BACKGROUND

Traditional programmable integrated circuits (ICs) such as Complex PLDs (CPLDs) and Field Programmable Gate Arrays (FPGAs) typically use millions of Static Random Access Memory (SRAM) configuration memory cells to program the functionality of the implemented circuit. The presence of an increasing number of SRAM configuration memory cells in a programmable IC, with chip geometries becoming smaller and supply voltages becoming lower, increases the likelihood that the configuration memory cell storage state will become upset due to collisions with cosmic particles from outer space or alpha particles from IC packaging materials. The unexpected change in state of a memory cell is referred to as a single event upset (SEU). With SEUs more likely to occur, the mean time to failure for a particular program configuration for the programmable IC will decrease.

It is desirable to provide methods of increasing the mean time to failure for a particular program configuration in a programmable IC by protecting against SEUs.

SUMMARY

According to a method of processing a circuit design for protecting against single event upsets (SEUs), a logic path of the circuit design is selected for redundancy based on a total of failure rates of circuit elements in the logic path being greater than a product of a target reduction in failure rate of the logic path and a failure rate of a voting circuit. The method modifies the circuit design to include at least three instances of the logic path coupled in parallel and the voting circuit coupled to receive output signals from the at least three instances, and the modified circuit design is stored in a memory.

A system for processing a circuit design for protecting against single event upsets (SEUs) includes one or more processors and a memory coupled to the one or more processors. The memory is configured with instructions that when executed by the one or more processors cause the one or more processors to select a logic path of the circuit design for redundancy based on a total of failure rates of circuit elements in the logic path being greater than a product of a target reduction in failure rate of the logic path and a failure rate of a voting circuit. The circuit design is modified to include at least three instances of the logic path coupled in parallel and the voting circuit coupled to receive output signals from the at least three instances. The system stores the circuit design as modified in the memory.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings, in which:

FIG. 1 shows circuit elements in an example logic path of a circuit design;

FIG. 2 shows the logic path of FIG. 1 in which a portion of the logic path has been triplicated and a voting circuit provides triple modular redundancy (TMR);

DETAILED DESCRIPTION

Figure 3:
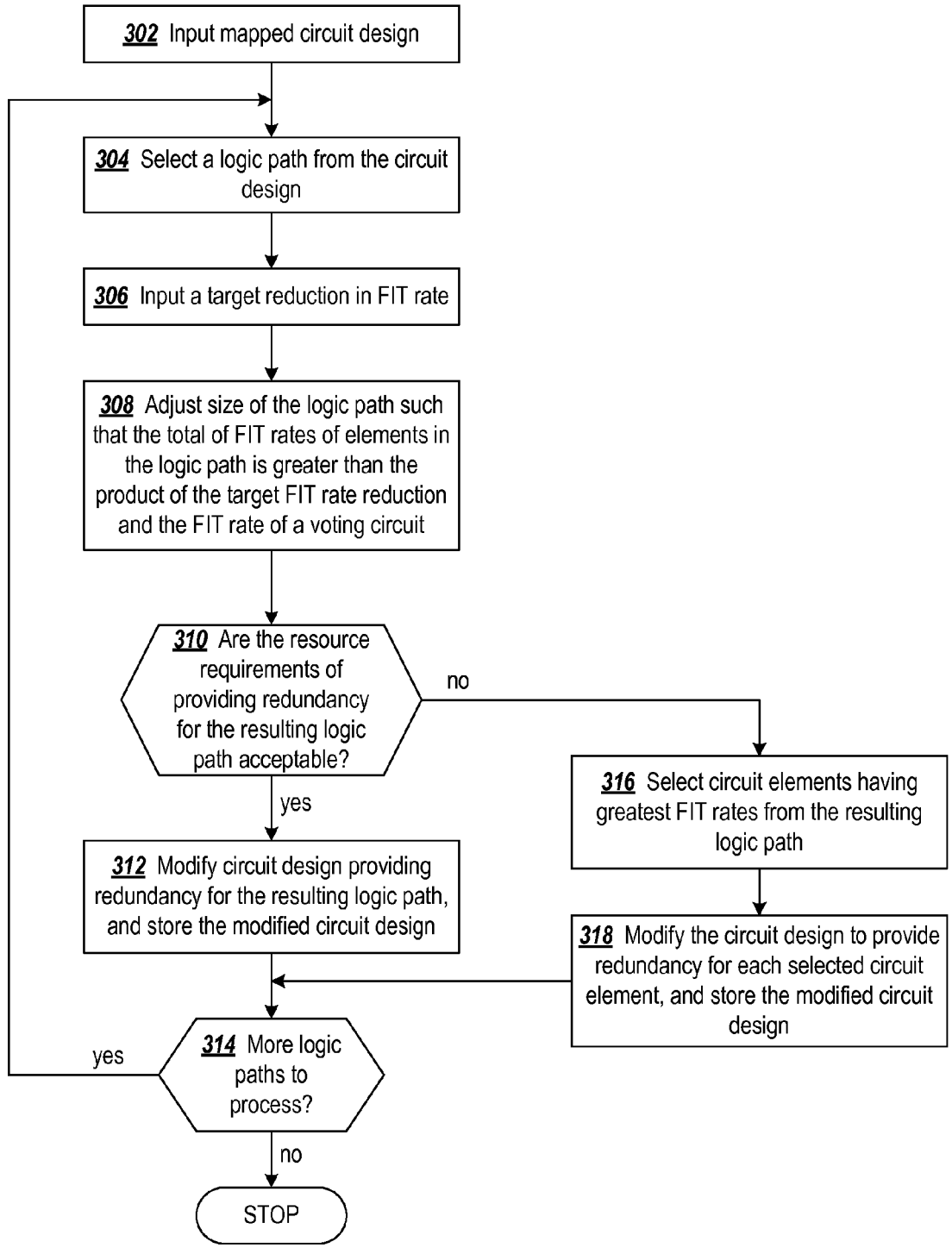
FIG. 3 is a flowchart of an example process for selecting logic paths or circuit elements from a circuit design and providing redundancy for the selected logic paths or circuit elements.

The processes and circuits disclosed herein are described in terms of triple modular redundancy (TMR) of circuit designs implemented in programmable ICs. However, it will be recognized that the described approaches may be applicable to greater levels of redundancy, for example, quintuple modular redundancy, as well as to designs for application specific integrated circuits.

Some past efforts have focused on protecting memory cells that have been determined to be critical to the design. In the context of programmable ICs, circuit elements such as lookup tables or flip-flops controlled by these critical memory cells or elements having a high toggle rate were made TMR. Though the elements dependent on the critical memory cells would be protected through TMR, large portions of the circuit may remain unprotected and susceptible to corruption from SEUs. In other instances, large portions of the circuit may be protected, which would likely include protection for non-critical memory cells and consume a large number of extra resources. It may be unfeasible to make all parts of the circuit design TMR, since TMR imposes large costs in terms of area, power consumption, and performance. Thus, it would be desirable to provide a desired level of protection by making selected parts of a circuit design TMR, and not making other parts of the circuit design TMR, if making those other parts TMR would not provide an appreciable increase in the protection against corruption due to SEUs.

In the disclosed methods and systems that process a circuit design for protecting against SEUs, instead of focusing on individual memory cells or individual LUTs determined to be critical, logic paths are evaluated and protected with TMR if doing so would provide a desired level of improvement. In an example implementation, the circuit elements on individual logic paths of a circuit design are evaluated. The probability of failure in the logic path is judged relative to a desired reduction in the failure rate for the logic path and the probability of failure for a voting circuit if the logic path were to be triplicated. Specifically, the total of the failure rates of the circuit elements on the logic path are compared to the product of a target level of reduction in the failure rate of the logic path and the failure rate of a voting circuit that would be used for TMR of the logic path. In an example implementation, respective failure in time (FIT) rates may be used as the failure rates. The respective failure rates used the calculations may be obtained from a database having known or estimated failure rates of the various circuit elements. If the total of the failure rates of the circuit elements on the logic path is greater than the product of the target level of reduction in the failure rate of the logic path and the failure rate of the voting circuit, then the logic path is made TMR in the circuit design. The disclosed approach for selecting logic paths to triplicate does not require simulation as do prior approaches that identify high toggle rates and feedback loops. In addition, the disclosed approach will provide a greater ratio of protected bits to the number of triplicated LUTs than previous techniques, which may provide a greater level of improvement in protection against SEUs relative to the increase in resource requirements.

FIG. 1 shows circuit elements in an example logic path 100 of a circuit design. Though only one logic path is shown, it will be appreciated that logic designs include many additional and interconnected logic paths. The logic path 100 includes circuit elements 102, 104, 106, . . . , 116 and is a candidate for TMR. In a programmable IC, the circuit elements may be LUTs or flip-flops. In an ASIC, the circuit elements may be flip-flops and other combinational logic elements. Element 110 is shown as a dashed block to indicate that additional circuit elements may be included in the logic path.

Depending on the individual failure rates of the circuit elements, it may be beneficial to make a sub-path of the logic path 100 TMR rather than making the entire logic path 100 TMR. For example, the additional space, added power consumption, and reduced performance may not justify making the entire path 100 TMR. Instead, a logic path that is a sub-path of path 100 may be made TMR. Such is the case for programmable IC LUTs having a small number of inputs that are used. If only a small number of inputs are used, then only a small number of configuration memory bits are used by the LUT, resulting in a relatively lower FIT rate for the LUT. Larger LUTs in which all or most of the inputs are used would have a relatively higher FIT rate.

In an example implementation, whether a logic path under consideration should be made TMR may be determined based on the following equation:

$$\Sigma_{i=1}^{n}(FIT_{logic\ element\ i}) > X^* FIT_{voter}$$

where n is the number of logic elements in the logic path, $FIT_{logic\ element\ i}$ is the FIT rate of logic element i, X is the target reduction in the FIT rate of the circuit design, and $FIT_{voter}$ is the FIT rate of the voter circuit which would be used for the triplicated logic path. X is generally a percentage or a fraction less than 1. For example, the target reduction in FIT rate may be to reduce the FIT rate by 50% or by ½. If the total of the FIT rates of the circuit elements in the logic path is greater than the product of the target reduction in FIT rate and the FIT rate of the voter circuit, then the logic path may be made TMR. For programmable ICs, the equation may be more specifically stated as:

$$(\Sigma_{i=1}^{n} FIT_{FFi} + \Sigma_{i=1}^{n} 2^{k*} FIT_{LUTi}) > X^* 2^{3*}(FIT_{voter\ LUT})$$

where $FIT_{FFi}$ is the failure rate of flip-flop i, $FIT_{LUTi}$ is the failure rate of LUT i, k is the number of inputs used on LUTi, and the $2^x$ term by which the $FIT_{LUTi}$ and $FIT_{voter\ LUT}$ terms are multiplied factors the number of LUT inputs that are used into the calculation. If k inputs are used, then $2^k$ memory cells are used by the LUT. Since for majority voting at least three incoming redundant signals are required (from three separate instance of the logic path), the majority voter LUT will have at least three inputs.

FIG. 2 shows the logic path of FIG. 1 in which a portion of the logic path has been triplicated and a voting circuit 122 has been added to provide TMR. Circuit elements 106, 108, 110, 112, and 114 are triplicated and connected in parallel, with the output signals from the instances of element 114 being input to the voting circuit 122. The state of the output signal from the majority voting circuit 122 is the state indicated by the output signals from at least two of the instances of element 114. The output signal from element 122 is input to the circuit element 116, which was not triplicated.

The portion of the logic path 100 selected for triplication is made based on the equations described above. Circuit elements 102, 104, and 116 are not included in the TMR logic 124. These elements may be of types for which the resources required for triplication would not provide a desired amount of reduction in susceptibility to corruption due to SEUs. For example, in programmable ICs there are LUTs having different numbers of selection inputs, and such LUTs are referred to as having different sizes. A LUT having k inputs selects from $2^k$ memory cells. Thus, a LUT having 3 inputs selects from 8 memory cells, whereas a LUT having 6 inputs selects from 64 memory cells. Since larger LUTs use many more memory cells, making larger LUTs part of TMR logic provides a greater reduction in the failure rate of a circuit path than does making smaller LUTs or individual flip-flops part of TMR logic. An example scenario in which circuit elements 102, 104, and 116 are not included in the TMR logic 124 may be where circuit element 102 is a 2-input LUT, circuit element 104 is a flip-flop, circuit element 116 is a 3-input LUT, and LUTs 106 and 114 are both 6-input LUTs having most or all of the inputs used by the circuit design.

FIG. 3 is a flowchart of an example process for selecting logic paths or circuit elements from a circuit design and providing redundancy for the selected logic paths or circuit elements. At block 302, the process inputs a mapped circuit design. With a mapped circuit design, the circuit elements to which the logic of the circuit design has been mapped are available for subsequent operations in the process.

A logic path of the circuit design is selected at block 304. In an example implementation, a logic path may be selected if the logic path has a desired number of LUTs having more than a threshold number of inputs. At block 306, a target level of reduction in the failure rate of the circuit design is input. In an example implementation, the target value may be interactively solicited from a user, or the user may input a target failure rate, and a target level of reduction may be computed based on the target failure rate relative to a computed present failure rate of the circuit design. Alternatively, the target value may be set as a default configuration parameter.

At block 308, the size of the selected logic path is adjusted using the equations described above. The number of elements in the logic path may be increased or decreased, depending on the total failure rate of the logic path relative to the product of the target reduction in failure rate of the logic path and the failure rate of the majority voting circuit. If the total failure rate of the logic path is less than the product of the target reduction in failure rate of the logic path and the failure rate of the majority voting circuit, additional circuit elements may be added to the logic path based on other logic paths and elements that provide input terms to the original logic path. If the total failure rate of the logic path is much greater than the product of the target reduction in failure rate of the logic path and the failure rate of the majority voting circuit, the logic path may be reduced by considering only a sub-path of the logic path, such as shown in FIG. 2. In some instances, reducing the size of the logic path to be provided with redundancy may provide a desired level of reduction in the failure rate without increasing the resource requirements beyond what may be acceptable.

At decision block 310, the process determines whether or not the resource requirements for providing redundancy for the resulting logic path (e.g., making the resulting logic path TMR) are acceptable. For example, making the resulting logic path TMR might result in the circuit design requiring more circuit resources than a target number of resources or that are available on the target device or requiring more power than is acceptable. If the resource requirements are acceptable, the circuit design is modified at block 312 to provide redundancy for the resulting logic path (e.g., to include three instances of the resulting logic path coupled in parallel), and the modified circuit design is stored for additional processing. A majority voting circuit is also added to receive the output signals from the instances of the logic path. Decision block 314 determines whether or not there are more logic paths to process. If so, the process returns to block 304 to select another logic path to process. Otherwise, the process is complete.

If decision block 310 determines that the resource requirements for providing redundancy for the logic path are greater than permitted, the process proceeds to block 316. Since the resource requirements for providing redundancy for the entire path are too great, redundancy may be provided to individual circuit elements. At block 316, the process selects circuit elements in the logic path that have the greatest failure rates. In a programmable IC, for example, LUTs in the logic path having numbers of used inputs greater than a threshold are selected. For example, if the logic path uses 6-input LUTs of a programmable IC, the process may select those LUTs having 5 or more inputs that are used.

At block 318, the process modifies the circuit design to provide redundancy for each of the circuit elements selected at block 316, and the modified circuit design is stored in a processor readable memory for additional processing. For example, for each of the selected circuit elements, the circuit element may be triplicated and connected in parallel, and a respective majority voting circuit may be connected to receive the output signals from the triplicate instances of the circuit element. The process then continues at decision block 314 to check for more logic paths to process.

Figure 4:
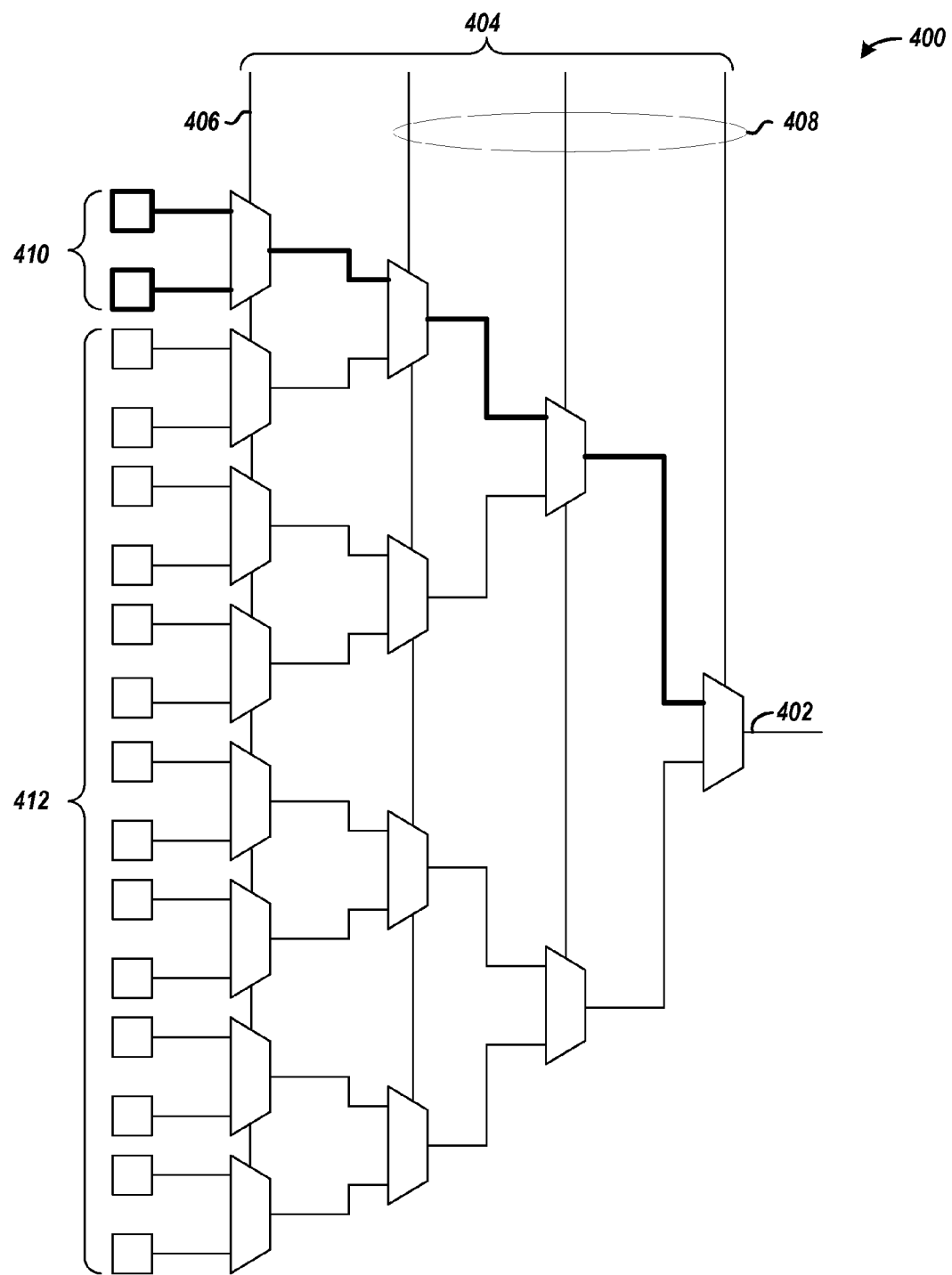
FIG. 4 shows an example 4-input lookup table (LUT) in which only one of the input selection bits is used.

FIG. 4 shows an example 4-input lookup table (LUT) 400 in which only one of the input selection bits is used. The example LUT 400 is a 4-input LUT and is connected to 16 memory cells. A multiplexer tree generates an output signal 402 based on the states of the memory cells and the states of the input signals. Of the 4 input selection signals 404, input selection signal 406 is used and input selection signals 408 are unused. Only memory cells 410 are used by the LUT 400, because only one input selection signal 406 is used by the circuit design. Thus, even though LUT 400 has 16 memory cells that might be corrupted from an SEU, of the 16 memory cells only an SEU of either of memory cells 410 could be problematic. Since memory cells 412 are unused, an SEU of those memory cells would not create problems during operation of the circuit.

With larger LUTs, the number of input selection signals that are used may be used in selecting which LUTs to make TMR and determining the failure rate of the LUT in the equations described above. For example, if a circuit design uses only one input of a 6-input LUT, the contribution of the failure rate of the LUT to the overall failure rate of the circuit design would be small since only two memory bits are used by the LUT. However, if all 6 inputs are used, then all 64 bits would be used by the LUT, and the contribution to the overall failure rate would be significantly greater.

Figure 5:
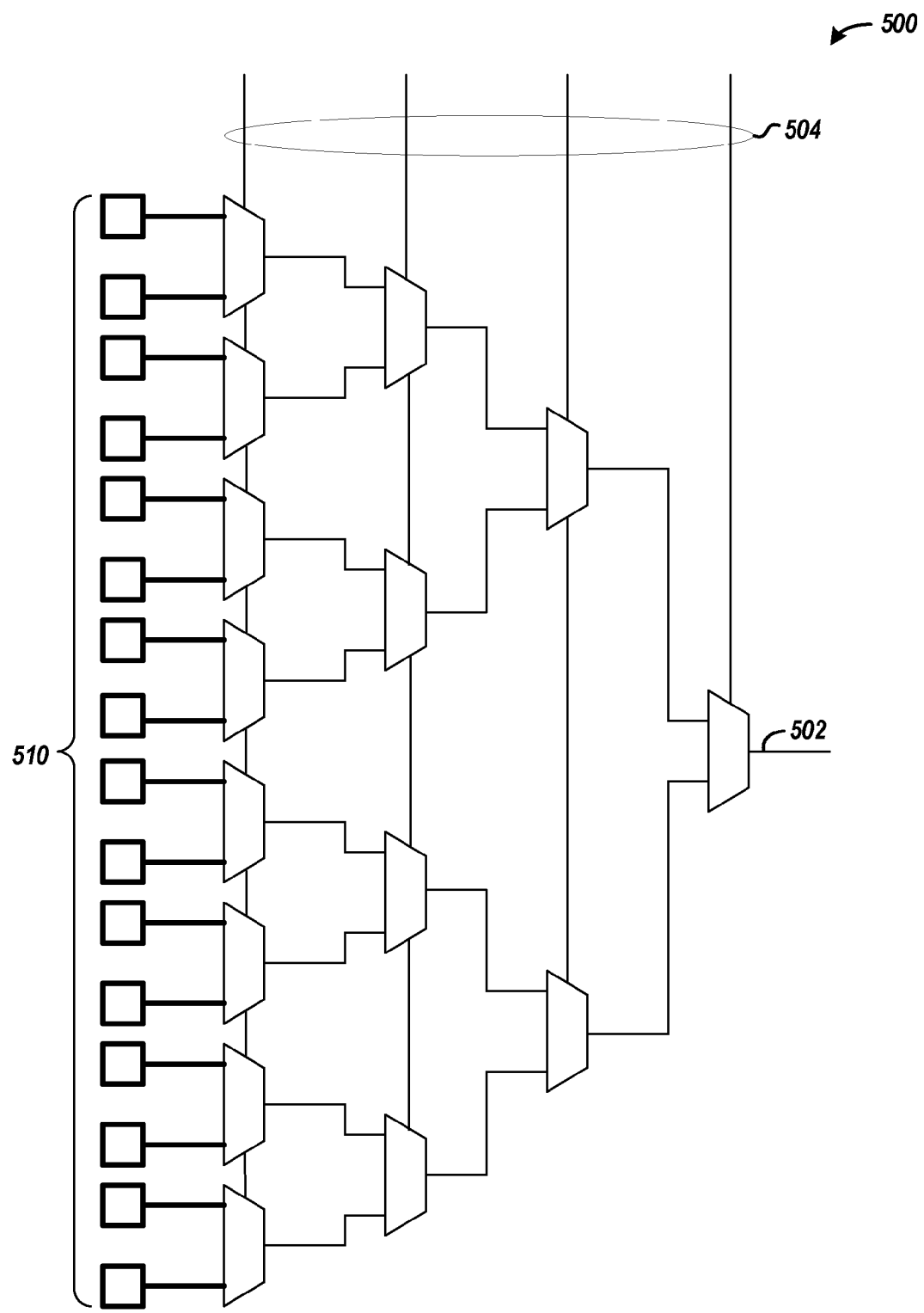
FIG. 5 shows an example 4-input LUT in which all 4 of the input selection bits are used.

FIG. 5 shows an example 4-input LUT 500 in which all 4 of the input selection bits are used. The multiplexer tree generates an output signal 502 based on the states of the memory cells and the states of the input signals. All 4 input selection signals 504 are used by the circuit design, and therefore, all 16 memory cells 510 are used by the LUT 500. Any one of the 16 memory cells corrupted from an SEU could be problematic.

Figure 6:
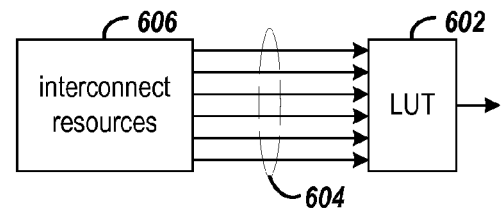
FIG. 6 shows an example 6-input LUT.
Figure 7:
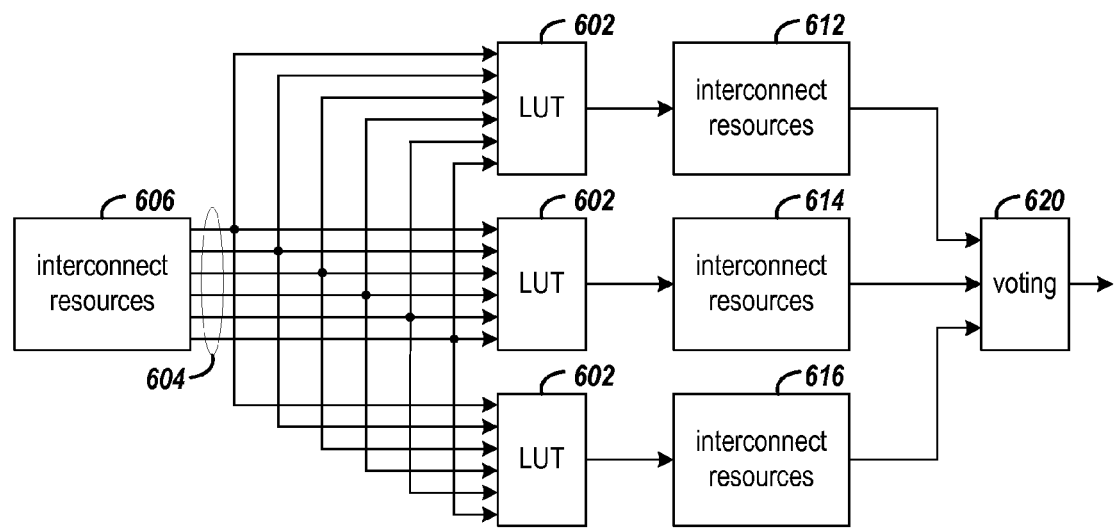
FIG. 7 shows triplication of the individual LUT of FIG. 6 to provide TMR.

FIG. 6 shows an example 6-input LUT 602, and FIG. 7 shows triplication of the individual LUT of FIG. 6 to provide TMR. The input signals 604 are provided by interconnect resources 606, which in a programmable IC are configurable to route signals. In FIG. 7, three instances of LUT 602 are connected in parallel to receive the input signals 606. The respective output signals from the instances of the LUT 602 are routed through different sets of interconnect resources 612, 614, and 616 to the majority voting circuit 620. The interconnect resources 612, 614, and 616 do not add to the failure rate, because the interconnect resources provide redundant signal paths from the instances of the LUT to the majority voting circuit.

Figure 8:
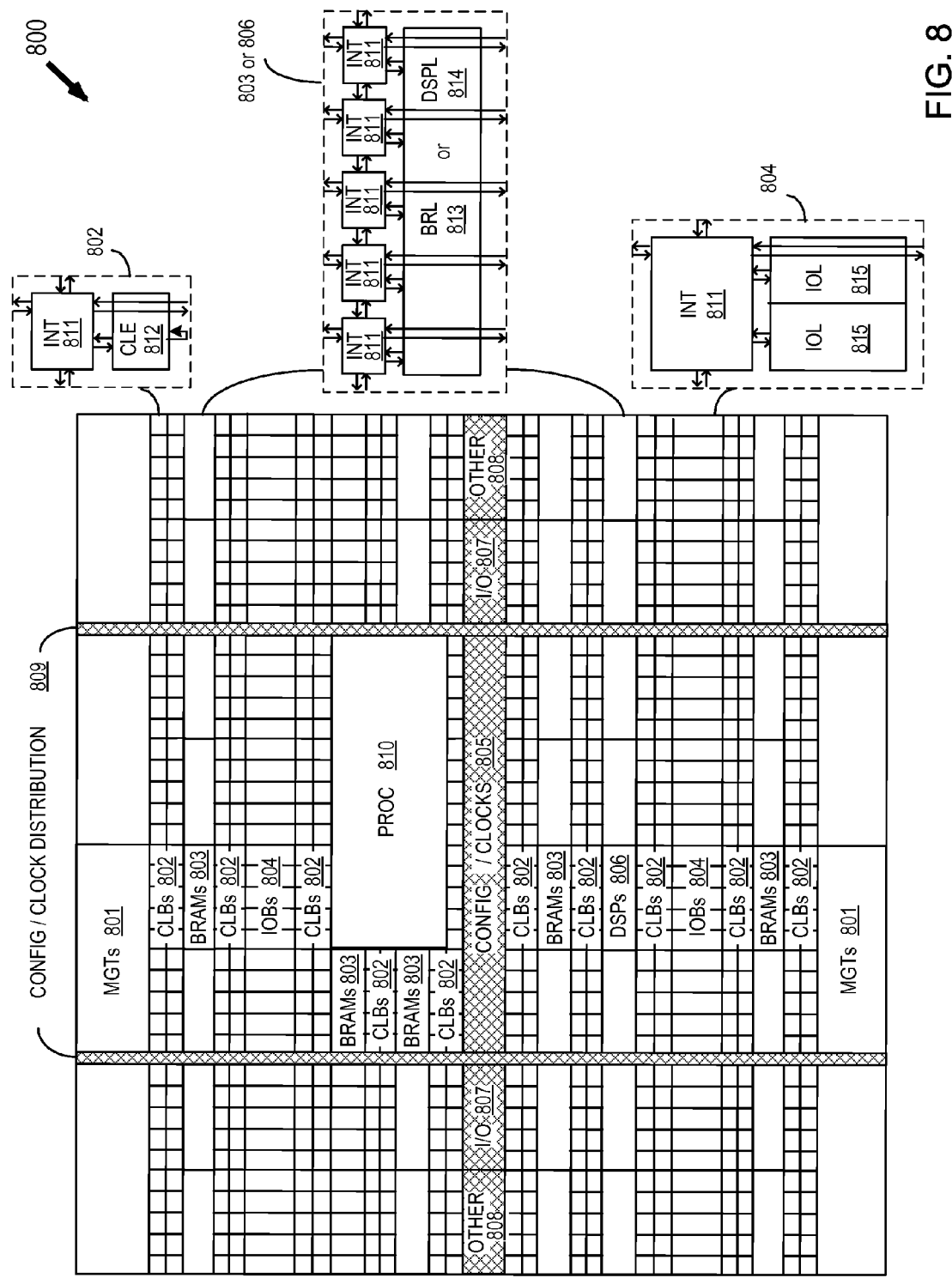
FIG. 8 is a block diagram of an example programmable integrated circuit.

FIG. 8 is a block diagram of an example programmable integrated circuit. The programmable IC includes field programmable gate array (FPGA) logic. The programmable resources of FPGAs can include several different types of programmable logic blocks in the array. For example, FIG. 8 illustrates an FPGA architecture (800) that includes a large number of different programmable tiles including multi-gigabit transceivers (MGTs) 801 having serializer-deserializer (SERDES) circuits, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some FPGAs also include dedicated processor blocks (PROC) 810 and internal and external reconfiguration ports (not shown).

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA, more than one adjacent column of CLBs is typically included wherever the CLBs appear, to facilitate the efficient implementation of user logic.

Figure 9:
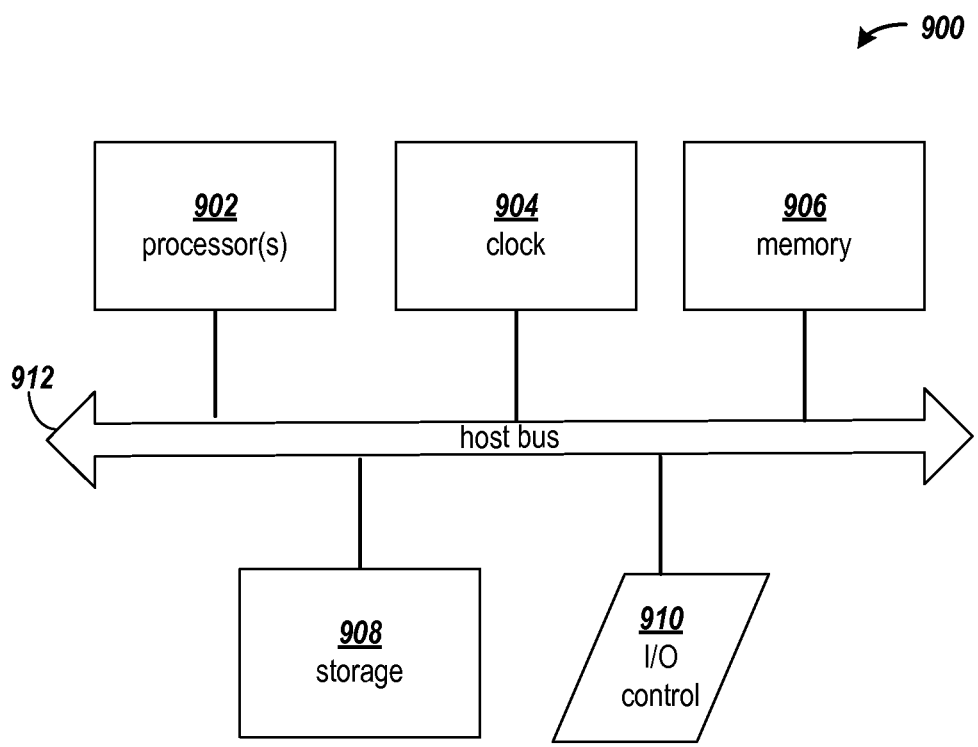
FIG. 9 shows a block diagram of an example computing arrangement that may be configured to implement the data structures and processes described herein.

FIG. 9 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 900 includes one or more processors 902 that are programmed according to the executable computer code, a clock signal generator 904, a memory arrangement 906, a storage arrangement 908, and an input/output control unit 910, all coupled to a host bus 912. The arrangement 900 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 902 may be one or more general purpose processors, or a combination of one or more general purpose processors and suitable co-processors, or one or more specialized processors (e.g., RISC, CISC, pipelined, etc.).

The memory arrangement 906 typically includes multiple levels of cache memory, and a main memory. The storage arrangement 908 may include local and/or remote persistent storage, such as provided by magnetic disks (not shown), flash, EPROM, or other non-volatile data storage. The storage unit may be read or read/write capable. Further, the memory arrangement 906 and storage arrangement 908 may be combined in a single arrangement.

The processor(s) 902 executes the software in storage arrangement 908 and/or memory arrangement 906, reads data from and stores data to the storage arrangement 908 and/or memory arrangement 906, and communicates with external devices through the input/output control arrangement 910. These functions are synchronized by the clock signal generator 904. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for processing a circuit design for protecting against SEUs. Other aspects and features will be apparent to those skilled in the art from consideration of the specification. It is intended that the specification and drawings be considered as examples only, with a true scope of the invention being indicated by the following claims.

What is claimed is:

1. A method of processing a circuit design for protecting against single event upsets (SEUs), comprising:
performing on a programmed processor operations including:
selecting a logic path of the circuit design for redundancy based on a total of failure rates of circuit elements in the logic path being greater than a product of a target reduction in failure rate of the logic path and a failure rate of a voting circuit;
modifying the circuit design to include at least three instances of the logic path coupled in parallel and the voting circuit coupled to receive output signals from the at least three instances; and
storing the circuit design as modified in a processor readable memory.

2. The method of claim 1, wherein:
the circuit elements are programmable resources of a programmable integrated circuit (IC), and the programmable resources include lookup tables; and
the selecting of the logic path includes totaling failure rates of lookup tables on the logic path.

3. The method of claim 2, wherein the totaling of failure rates of the lookup tables on the logic path is a function of respective numbers of inputs that are used on each of the lookup tables.

4. The method of claim 2, wherein the failure rate of the voting circuit is a failure rate of a lookup table having at least three inputs that are used.

5. The method of claim 2, wherein:
the selecting of the logic path includes:
determining, from all logic paths in the circuit design, a plurality of logic paths that include a plurality of lookup tables having respective numbers of inputs greater than a threshold number; and
wherein the logic path selected for redundancy is one of the plurality of logic paths; and
the totaling of failure rates of the lookup tables on the logic path is a function of respective numbers of inputs that are used on each of the lookup tables.

6. The method of claim 2, wherein:
the programmable resources include flip-flops; and
the selecting of the logic path includes totaling the failure rates of the lookup tables on the logic path and failure rates of flip-flops on the logic path.

7. The method of claim 2, wherein:
the totaling of failure rates of the lookup tables on the logic path is a function of respective numbers of inputs that are used on each of the lookup tables;
the selecting of the logic path includes:
  determining whether or not circuit resources required for providing redundancy for the logic path exceed a target number of resources; and
  selecting from the logic path, in response to determining that the circuit resources required providing redundancy for the logic path exceed the target number of resources, a plurality of lookup tables having respective numbers of inputs greater than a threshold number; and
the modifying of the circuit design includes:
  modifying the circuit design to include for each of the plurality of lookup tables, in response to the determining that the circuit resources required for providing redundancy for the logic path exceed the target number of resources, at least three instances of the lookup table coupled in parallel and a respective voting circuit coupled to receive output signals from the at least three instances of the lookup table.

8. The method of claim 1, wherein:
the circuit elements are programmable resources of a programmable integrated circuit (IC), and the programmable resources include lookup tables and flip-flops; and
the selecting of the logic path includes adjusting a size of the logic path such that:

$$(\Sigma_{i=1}^{n}\text{FIT}_{FFi} + \Sigma_{i=1}^{n} 2^{k} * \text{FIT}_{LUTi}) > X * 2^{3} * (\text{FIT}_{voter\ LUT})$$

wherein $\text{FIT}_{FFi}$ is a failure rate of flip-flop i, $\text{FIT}_{LUTi}$ is a failure rate of LUT i, and k is a number of inputs used on LUTi.

9. The method of claim 8, wherein the selecting of the logic path includes:
determining from all logic paths in the circuit design, a plurality of logic paths that include a plurality of lookup tables having respective numbers of inputs greater than a threshold number; and
the logic path selected for redundancy is one of the plurality of logic paths.

10. The method of claim 8, wherein:
the selecting of the logic path includes:
  determining whether or not circuit resources required for providing redundancy for the logic path exceed a target number of resources; and
  selecting from the logic path, in response to determining that the circuit resources required for providing redundancy for the logic path exceed the target number of resources, a plurality of lookup tables having respective numbers of inputs greater than a threshold number; and
the modifying of the circuit design includes:
  modifying the circuit design to include, for each of the plurality of lookup tables, in response to the determining that the circuit resources required for providing redundancy for the logic path exceed the target number of resources, at least three instances of the lookup table coupled in parallel and a respective voting circuit coupled to receive output signals from the at least three instances of the lookup table.

11. A system for processing a circuit design for protecting against single event upsets (SEUs), comprising:
one or more processors; and
a memory coupled to the one or more processors, wherein the memory is configured with instructions that when executed by the one or more processors cause the one or more processors to:
  select a logic path of the circuit design for redundancy based on a total of failure rates of circuit elements in the logic path being greater than a product of a target reduction in failure rate of the logic path and a failure rate of a voting circuit;
  modify the circuit design to include at least three instances of the logic path coupled in parallel and the voting circuit coupled to receive output signals from the at least three instances; and
  store the circuit design as modified in the memory.

12. The system of claim 11, wherein:
the circuit elements are programmable resources of a programmable integrated circuit (IC), and the programmable resources include lookup tables; and
the instructions that cause the one or more processors to select the logic path include instructions that cause the one or more processors to total failure rates of lookup tables on the logic path.

13. The system of claim 12, wherein the instructions that cause the one or more processors to total the failure rates of the lookup tables on the logic path implement a function of respective numbers of inputs that are used on each of the lookup tables.

14. The system of claim 12, wherein the failure rate of the voting circuit is a failure rate of a lookup table having at least three inputs that are used.

15. The system of claim 12, wherein:
the instructions that cause the one or more processors to select the logic path include instructions that cause the one or more processors to:
  determine, from all logic paths in the circuit design, a plurality of logic paths that include a plurality of lookup tables having respective numbers of inputs greater than a threshold number; and
  wherein the logic path selected for redundancy is one of the plurality of logic paths; and
the instructions that cause the one or more processors to total the failure rates of the lookup tables on the logic path implement a function of respective numbers of inputs that are used on each of the lookup tables.

16. The system of claim 12, wherein:
the programmable resources include flip-flops; and
the instructions that cause the one or more processors to select the logic path include instructions that cause the one or more processors to total the failure rates of the lookup tables on the logic path and failure rates of flip-flops on the logic path.

17. The system of claim 12, wherein:
the instructions that cause the one or more processors to total the failure rates of the lookup tables on the logic path implement a function of respective numbers of inputs that are used on each of the lookup tables;
the instructions that cause the one or more processors to select the logic path include instructions that cause the one or more processors to:
  determine whether or not circuit resources required for providing redundancy for the logic path exceed a target number of resources; and select from the logic path, in response to determining that the circuit resources required for providing redundancy for the logic path exceed the target number of resources, a plurality of lookup tables having respective numbers of inputs greater than a threshold number; and the instructions that cause the one or more processors to modify the circuit design include instructions that cause the one or more processors to:

modify the circuit design to include for each of the plurality of lookup tables, in response to the determining that the circuit resources required for providing redundancy for the logic path exceed the target number of resources, at least three instances of the lookup table coupled in parallel and a respective voting circuit coupled to receive output signals from the at least three instances of the lookup table.

18. The system of claim 11, wherein:

the circuit elements are programmable resources of a programmable integrated circuit (IC), and the programmable resources include lookup tables and flip-flops; and the instructions that cause the one or more processors to select the logic path include instructions that cause the one or more processors to adjust a size of the logic path such that:

$$(\Sigma_{i=1}^{n} \text{FIT}_{FFi} + \Sigma_{i=1}^{n} 2^{k} * \text{FIT}_{LUTi}) > X * 2^{3} * (\text{FIT}_{voter\ LUT})$$

wherein $\text{FIT}_{FFi}$ is a failure rate of flip-flop i, $\text{FIT}_{LUTi}$ is a failure rate of LUT i, and k is a number of inputs used on LUTi.

19. The system of claim 18, wherein the instructions that cause the one or more processors to select the logic path include instructions that cause the one or more processors to:

determine from all logic paths in the circuit design, a plurality of logic paths that include a plurality of lookup tables having respective numbers of inputs greater than a threshold number; and the logic path selected for redundancy is one of the plurality of logic paths.

20. The system of claim 18, wherein:

the instructions that cause the one or more processors to select the logic path include instructions that cause the one or more processors to:

determine whether or not circuit resources required for providing redundancy for the logic path exceed a target number of resources; and select from the logic path, in response to the determining that the circuit resources required for providing redundancy for the logic path exceed the target number of resources, a plurality of lookup tables having respective numbers of inputs greater than a threshold number; and the instructions that cause the one or more processors to modify the circuit design include instructions that cause the one or more processors to:

modify the circuit design to include, for each of the plurality of lookup tables, in response to the determining that the circuit resources required for providing redundancy for the logic path exceed the target number of resources, at least three instances of the lookup table coupled in parallel and a respective voting circuit coupled to receive output signals from the at least three instances of the lookup table.

* * * * *